United States Patent [19]
Yamaguchi

[11] Patent Number: 5,515,313
[45] Date of Patent: May 7, 1996

[54] STATIC-TYPE SEMICONDUCTOR MEMORY DEVICE

[75] Inventor: Takashi Yamaguchi, Tokyo, Japan

[73] Assignee: NEC Corporation, Tokyo, Japan

[21] Appl. No.: 326,244

[22] Filed: Oct. 20, 1994

[30] Foreign Application Priority Data

Oct. 20, 1993 [JP] Japan ................................. 5-286001

[51] Int. Cl.⁶ .................................................. G11C 11/00
[52] U.S. Cl. ........................ 365/156; 365/154; 365/148; 257/537; 257/538
[58] Field of Search ..................... 365/156, 154, 365/148, 151; 257/538, 537, 536, 380

[56] References Cited

U.S. PATENT DOCUMENTS 4,961,103  10/1990  Saitoh et al. ...................... 257/380 X
5,159,430  10/1992  Manning et al. .................. 257/538 X

FOREIGN PATENT DOCUMENTS 2-58868  2/1990  Japan .

OTHER PUBLICATIONS

K. Ueda et al., "Improvement of Soft Error Immunity in a Polysilicon PMOS Load Memory Cell", Japanese–Electronics and Communication Association, Autumn Meeting, 1991, Paper C–27, P. 5–141.

Primary Examiner—David C. Nelms
Assistant Examiner—Huan Hoang
Attorney, Agent, or Firm—Sughrue, Mion, Zinn, Macpeak & Seas

[57] ABSTRACT

A static-type memory cell includes a flip-flop circuit formed with a pair of N-channel type MOS transistors for driving provided in a semiconductor substrate and a pair of P-channel type MOS transistor as load elements provided in the upper layer of the pair of driving N-channel type MOS transistors and formed with thin film transistors. The gate electrodes of the pair of P-channel type MOS transistor are load elements and are formed of polycrystalline silicon layers containing 2 to 45 atoms % of oxygen for maintaining high resistance in the P-channel type MOS transistor and thereby provide satisfactory resistance against soft errors.

17 Claims, 6 Drawing Sheets

STATIC-TYPE SEMICONDUCTOR MEMORY DEVICE

BACKGROUND OF THE INVENTION

1. Field of the Invention

The present invention relates generally to a static-type semiconductor memory device. More specifically, the invention relates to a static-type semiconductor memory device employing a thin-film transistor as a load element of a memory cell.

2. Description of the Related Art

Figure 5:
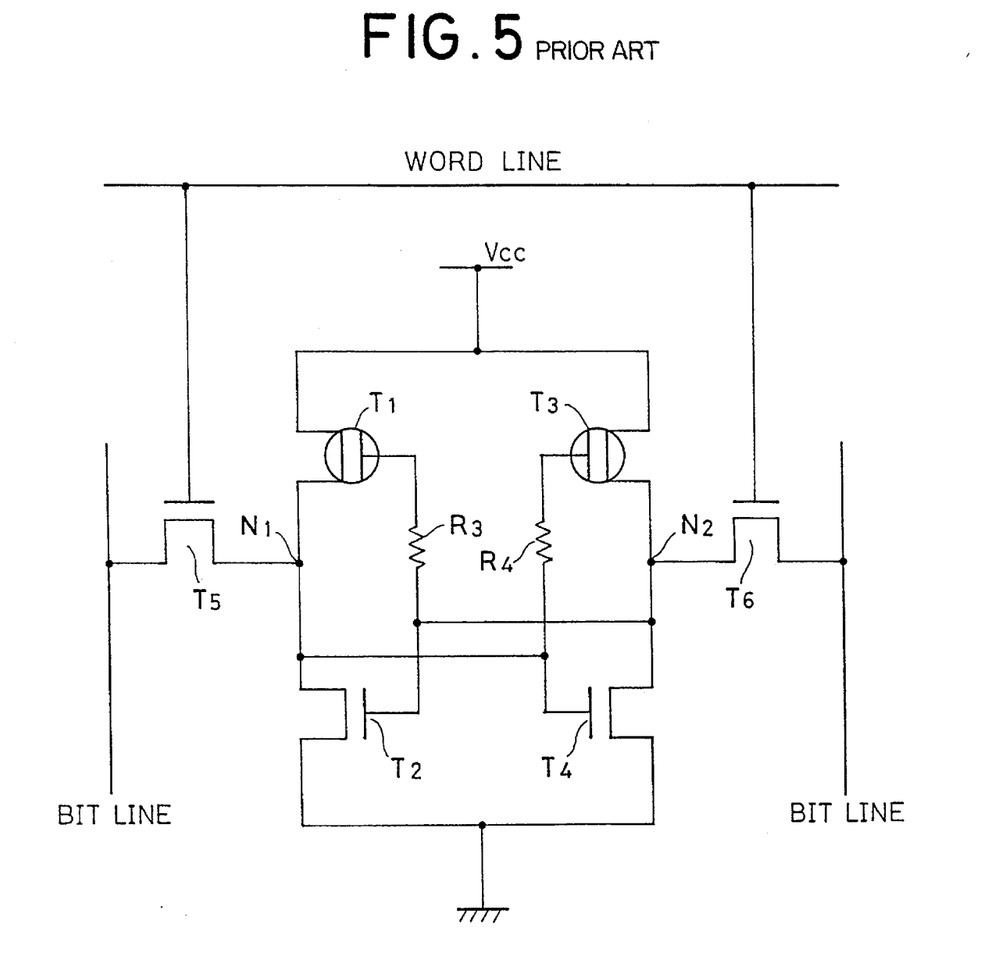
FIG. 5 is an equivalent circuit diagram of the conventional static-type semiconductor device.

The conventional static-type semiconductor memory device has a memory cell portion which can be illustrated by an equivalent circuit shown in FIG. 5. Namely, a flip-flop forming the memory cell portion is formed by cross-connection of an inverter circuit, in which a P-channel type MOS transistor T1 and a N-channel type MOS transistor T2 are connected in series, and an inverter circuit, in which a P-channel type MOS transistor T3 and a N-channel type MOS transistor T4 are connected in series.

In the flip-flop, data of "1" or "0" can be arbitrarily stored in a storage node N1 between the P-channel type MOS transistor T1 and the N-channel type MOS transistor T2 and a storage node N2 between the P-channel type MOS transistor T3 and the N-channel type MOS transistor T4.

N-channel type MOS transistors T5 and T6 connected to respective storage nodes N1 and N2 form transfer gates for reading and writing operation from and to the corresponding one of the storage nodes. These N-channel type MOS transistor T5 and T6 are connected to a word line and bit lines. By appropriately selecting these word line and bit lines, arbitrary ones of the memory cells can be selected. Here, R3 and R4 denote resistor elements.

In recent years, in a high package density memory, such as a static-type semiconductor memory device having greater than or equal to 4 Mbits of memory capacity, P-channel type MOS transistors T1 and T3 are formed with thin film transistors (TFT) and arranged in the upper layer of the N-channel type MOS transistors T2 and T4. Such technology is described in "Starting of 4 Mbits SRAM Manufacturing" (Nikkei Micro-Device, June, 1991, Vol. 72, pp 35 to 62).

Figure 6:
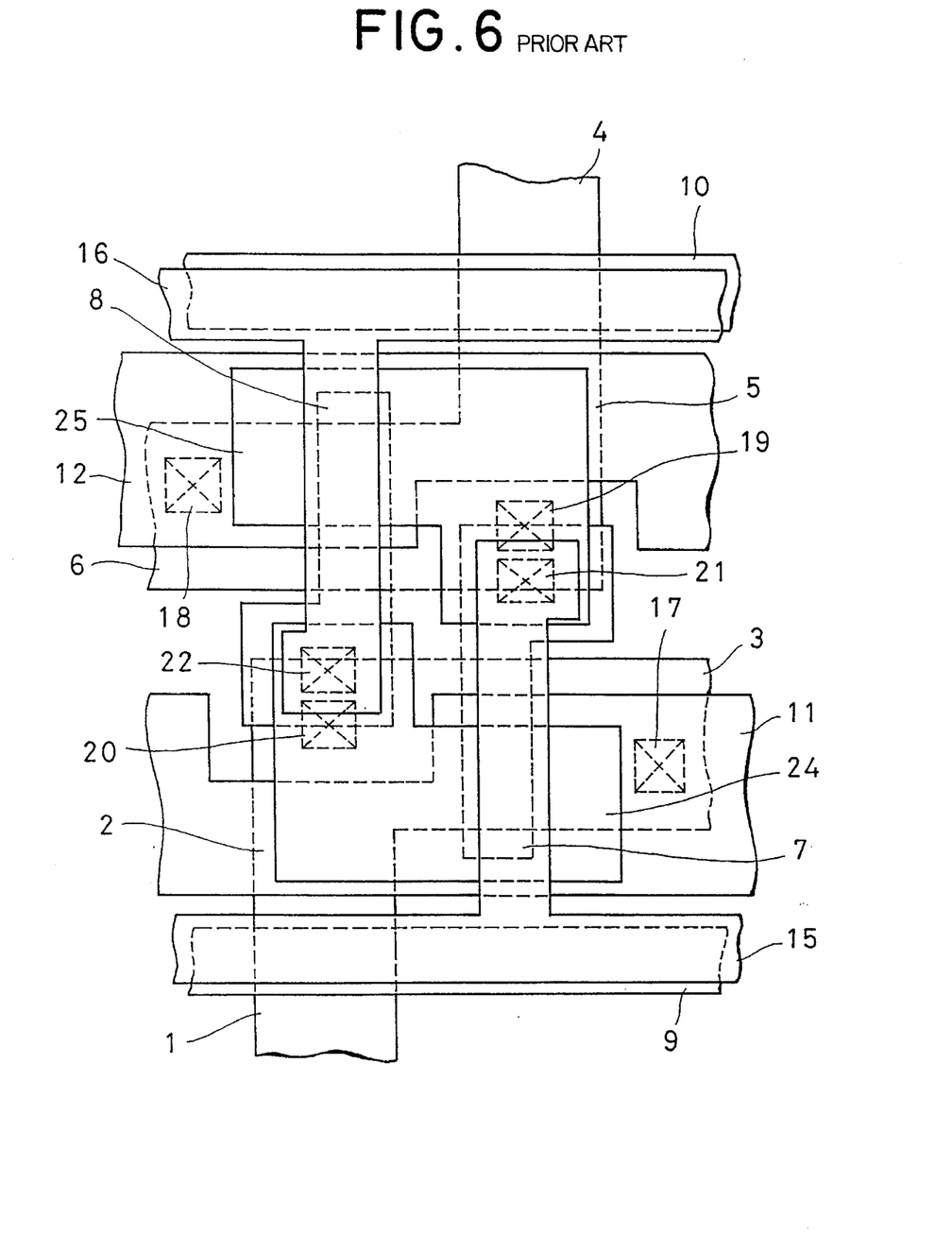
FIG. 6 is a plan view of the conventional static-type semiconductor device.

Namely, as shown in FIG. 6, N$^+$ type diffusion layers (impurity doped region) 1 to 3 selectively formed on the surface of a semiconductor substrate of silicon form source and drain regions of the N-channel type MOS transistors T4 and T6, and N$^+$ type diffusion layers 4 to 6 are source and drain regions of the N-channel type MOS transistors T2 and T5.

Reference numeral 7 denotes a gate electrode of the N-channel type MOS transistor T4 formed with a polycrystalline silicon layer (first polycrystalline silicon layer), and reference numeral 8 denotes a gate electrode of the N-channel type MOS transistor T2 formed with a polycrystalline silicon layer (first polycrystalline silicon layer).

Reference numerals 9, 10 denote word lines formed with the polycrystalline silicon layer (first polycrystalline silicon layer), which also serve as gate electrodes of the N-channel type MOS transistors T5 and T6. Reference numerals 11 and 12 denote grounding wiring (GND) of the N-channel type MOS transistors T2 and T4 formed with polycrystalline silicon layers (second polycrystalline silicon layer).

Reference numerals 24 and 25 denote TFT gate electrodes of the P-channel type MOS transistors T1 and T3 formed with the polycrystalline silicon layers (third polycrystalline silicon layer). Reference numerals 15 and 16 denote polycrystalline silicon layers (fourth polycrystalline silicon layer) serving as source and drain channel regions of the P-channel type MOS transistors T1 and T3 and also serving as Vcc wiring.

Reference numerals 17 and 18 denote through holes for connecting the N$^+$ diffusion layer and the grounding wiring, 19 and 20 denote through holes for simultaneously connecting the gate electrode, the TFT gate electrode and the N$^+$ diffusion layer, and 21 and 22 denote through holes connecting the TFT electrode and the TFT drain region.

In the N$^+$ diffusion layers 1 and 4, through holes (not shown) for connecting bit lines (not shown) are opened. With the construction set forth above, the memory cell on the surface of the semiconductor substrate is realized.

Figure 7:
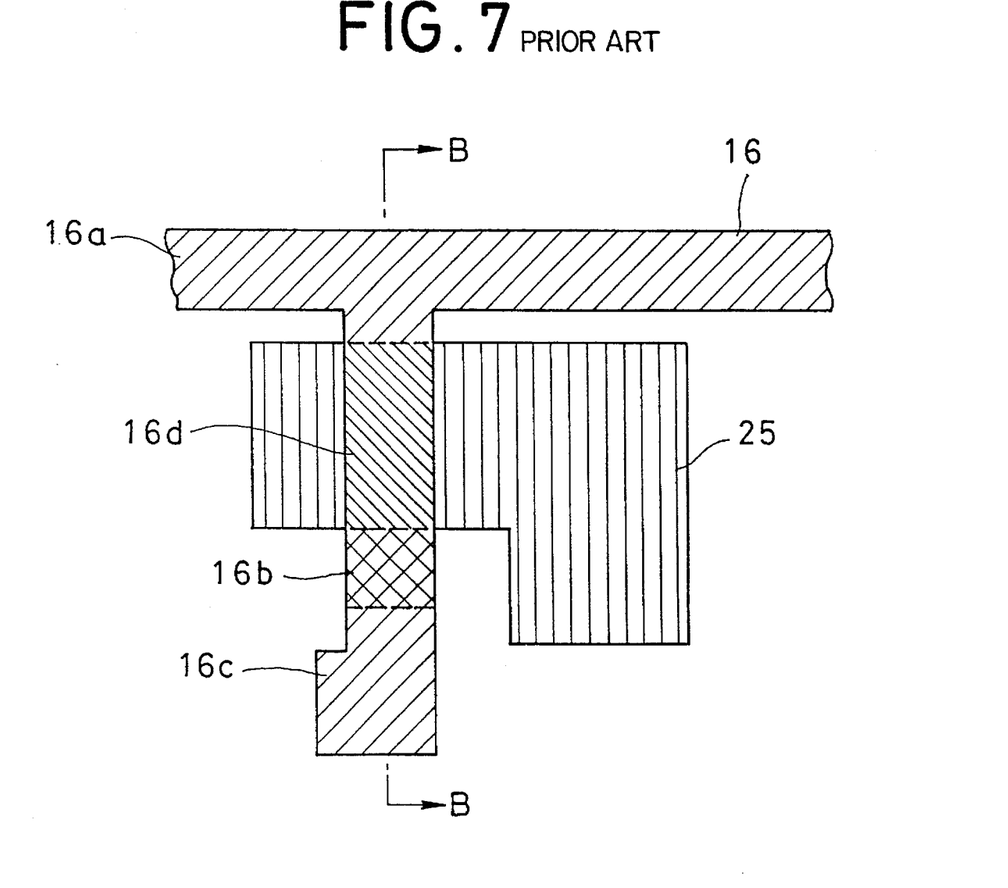
FIG. 7 is a plan view showing the conventional thin film transistor.
Figure 8:
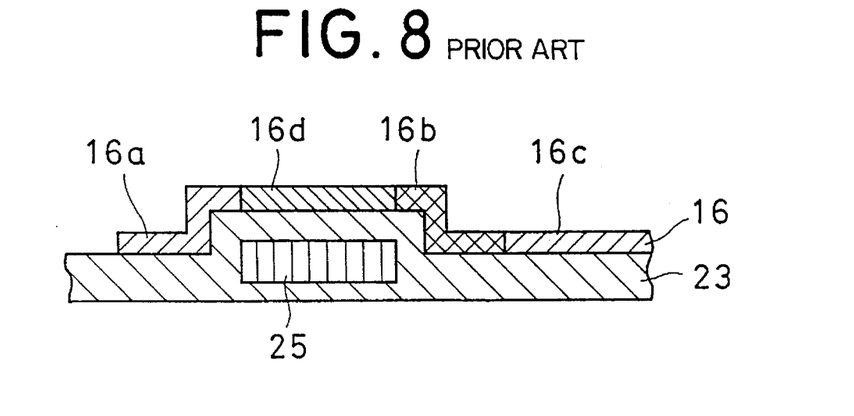
FIG. 8 is a section taken along line B—B of FIG. 7.

On the other hand, the thin film transistor arranged in the upper layer of the N-channel type MOS transistor T2 comprises TFT gate electrode 25 (third polycrystalline silicon layer), and the polycrystalline silicon layer (fourth polycrystalline silicon layer) forming the source, drain and channel regions of the P-channel type MOS transistor T1, as shown in FIGS. 7 and 8.

A P$^+$ implanting region 16a of the polcrystalline silicon layer 16 is a source region which also serves as the Vcc wiring. In the P$^+$ implanting region 16a, a high concentration P-type impurity (P$^+$) is implanted. A P$^-$ implanted region 16b and a P$^+$ implanted region 16c are drain regions. In the P$^-$ implanted region 16b, low concentration P-type impurity (P$^-$) is implanted, and in the P$^+$ implanted region 16c, high concentration P-type impurity (P$^+$) is implanted interfacing with the P$^-$ implanted region 16b. Here, 16d denotes a channel region.

Reference numeral 23 denotes an insulation layer disposed between the TFT gate electrode 25 and the polycrystalline silicon layer 16. With the construction set forth above, the thin film transistor is formed.

In the static-type semiconductor memory device as described above, there are problems in that a soft error can reverse stored data due to α ray generated from the package, the wiring material or so forth.

As a measure for such a soft error, there has been proposed a method to provide resistor elements R3 and R4 which are interposed between the P-channel type MOS transistor T1 and the N-channel type MOS transistor T2 and between the P-channel type MOS transistor T3 and the N-channel type MOS transistor T4, and to make the resistor elements R3 and R4 of a high resistance.

Such technology has been recorded in Ueda, Sasaki, Ishibashi, Yamanaka, "Improvement of Soft Error Immunity in a Polysilicon PMOS Load Memory Cell", Japanese Electronics and Communication Association, Autumn Meeting, 1991, Paper C-427, pp 5–141, which reports that providing high resistances for the resistor elements R3 and R4, resistance against the soft error can be improved.

Higher resistivity of the resistor elements R3 and R4 can be achieved by providing higher resistance for sheet resistance of the TFT gate electrodes 24 and 26. Since typically $1 \times 10^{19}$ to $1 \times 10^{29}$ atoms/cm$^3$ of phosphorous ion is introduced in the TFT gate electrodes 24, 25, higher resistivity can be achieved by reducing the introduction amount of the phosphorous ion to $1 \times 10^{17}$ to $1 \times 10^{19}$.

Discussion will be given for the soft error with reference to FIG. 5. In FIG. 5, it is assumed that respective data "1" and "0" are stored in the storage nodes N1 and N2. When α ray generated from the package and so forth hits the storage node N1, the charge stored in the storage node N1 is withdrawn to reverse the content of the storage node N1 from "1" to "0".

Accordingly, the P-channel type MOS transistor T3 and the N-channel type MOS transistor T4 taking the potential of the storage node N1 as gate input are respectively turned ON and OFF. As a result, the content of the storage node N2 is reversed from "0" to "1". Therefore, the data stored in the memory cell is completely destroyed.

Here, when high resistance is provided for the resistor element R4, the transfer speed from the storage node N1 to the TFT gate electrode of the P-channel type MOS transistor T3 is reduced significantly to make the P-channel type MOS transistor T3 difficult to turn ON. As a result, reversal of the storage node N2 from "0" to "1" can be prevented.

Also, since the content of the storage node N2 is held "0", the storage node N1 which is once reversed can be recharged by the P-channel type MOS transistor T1 to be restored from "0" to "1".

Therefore, even when α ray hits the storage node of the memory cell, the stored data in the memory cell cannot be destroyed. As set forth above, by providing higher resistance for the resistor elements R3 and R4, resistance against the software error can be improved.

Here, discussion will be given for the problem to provide high resistance for the resistor elements R3 and R4 and thus for the TFT gate electrodes. In a heat treatment step in the process of fabrication of the semiconductor device, it is possible that phosphorous ion introduced into the gate electrode (first polycrystalline silicon layer) is diffused to the TFT gate electrode through the through holes.

Namely, despite the reduction of the amount of phosphorous ion introduced into the TFT gate electrode for higher resistance, it is possible not to achieve high resistance of the TFT gate electrode since the phosphorous ion can be introduced into the gate electrode (first polycrystalline silicon layer) through the through hole.

SUMMARY OF THE INVENTION

The present invention intends to solve the problem in the prior art as set forth above. Therefore, it is an object of the present invention to provide a static-type semiconductor device which can maintain high resistance at a TFT gate electrode even when phosphorous ion is introduced through a through hole and thus can realize a memory cell having excellent soft error resistance.

According to one aspect of the invention, a static-type memory cell comprises:

a flip-flop circuit formed with a pair of N-channel type MOS transistors for driving provided in a semiconductor substrate and a pair of P-channel type MOS transistor as load elements provided in the upper layer of the pair of driving N-channel type MOS transistors and formed with thin film transistors;

gate electrodes of the pair of P-channel type MOS transistor as load elements being formed of polycrystalline silicon layers containing 2 to 45 atoms % of oxygen.

According to another aspect of the invention, a static-type semiconductor memory device comprises:

a memory cell array constituted of flip-flop circuits, each being formed with a pair of N-channel type MOS transistors for driving provided in a semiconductor substrate and a pair of P-channel type MOS transistor as load elements provided in the upper layer of the pair of driving N-channel type MOS transistors and formed with thin film transistors;

gate electrodes of the pair of P-channel type MOS transistors as load elements being formed of polycrystalline silicon layers containing 2 to 45 atoms % of oxygen.

According to a further aspect of the invention, a memory cell for forming a static-type semiconductor memory device, the memory cell including a flip-flop circuit formed with a pair of first conductive type MOS transistors for driving provided in a semiconductor substrate and a pair of second conductive type MOS transistors as load elements provided in the upper layer of the pair of the first conductive type MOS transistors and formed with thin film transistors, comprises:

first conductive type impurity diffused region formed on the semiconductor substrate;

first polycrystalline silicon layer defining gate electrodes and word lines of the first conductive type MOS transistors;

second polycrystalline silicon layer defining grounding wiring of the first conductive type MOS transistor;

third polycrystalline silicon layer defining TFT gate electrodes of the second conductive type MOS transistors, the third polycrystalline silicon layer being formed of polycrystalline silicon containing oxygen in a range of 2 to 45 atoms %; and fourth polycrystalline silicon layer defining source and drain channel regions and Vcc wiring for the second conductive type MOS transistors;

a first through hole connecting the first conductive type impurity diffused layer and the grounding wiring; and a second through hole connecting the gate electrode of the first conductive type MOS transistor, the TFT gate electrode of the second conductive type MOS transistor and the first conductive type impurity diffused region.

BRIEF DESCRIPTION OF THE DRAWING

The present invention will be understood more fully from the detailed description given hereinbelow and from the accompanying drawings of the preferred embodiment of the present invention, which, however, should not be taken to limit to the invention, but are for explanation and understanding only.

In the drawings.

DESCRIPTION OF THE PREFERRED EMBODIMENT

The present invention will be discussed hereinafter in detail with reference to the drawings, particularly to FIGS.

1 to 4. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessarily obscuring the present invention.

One embodiment of a semiconductor device according to the present invention is similar that of FIGS. 5 to 8 except for the material of a TFT gate electrode, which is changed from that formed of a polycrystalline silicon to polycrystalline silicon (SIPOS) containing 2 to 45 atoms % of oxygen. In the following disclosure, like reference numerals represent like elements to those in the prior art set forth above.

Figure 1:
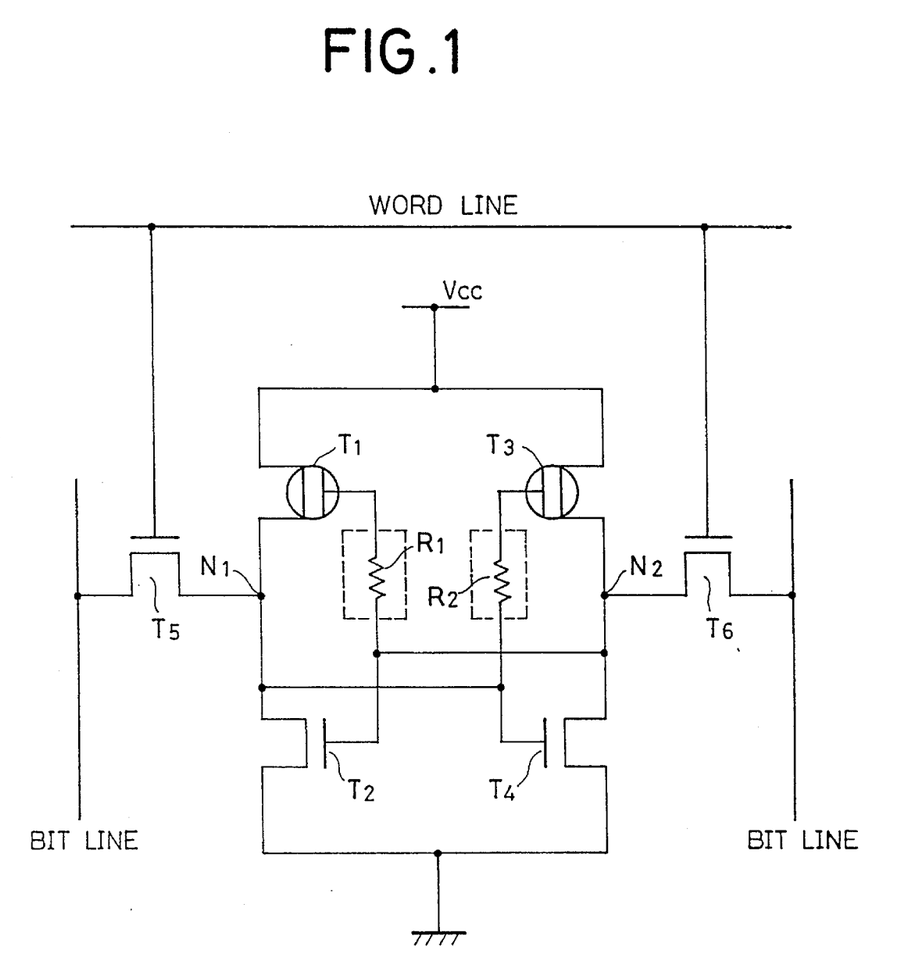
FIG. 1 is an equivalent circuit diagram of one embodiment of a static-type semiconductor device according to the present invention.

Namely, in one embodiment of the semiconductor device according to the present invention, the flip-flop forming the memory cell portion comprises the inverter, in which the P-channel type MOS transistor T1 and the N-channel type MOS transistor T2 are connected in series, and the inverter, in which the P-channel type MOS transistor T3 and the N-channel type MOS transistor T4 are connected in series. Like the foregoing prior art, the inverters are connected in cross connection.

In the flip-flop circuit, data of "1" and "0" can be arbitrarily stored in the storage node N1 between the P-channel type MOS transistor T1 and the N-channel type MOS transistor T2 and in the storage node N2 between the P-channel type MOS transistor T3 and the N-channel type MOS transistor T4.

The N-channel type MOS transistors T5 and T6 are connected to the storage nodes N1 and N2 to form transfer gates and connected to word line and bit lines. By appropriately selecting the word lines and the bit lines arbitrary memory cell can be selected. Here, R1 and R2 are resistor elements.

The above-mentioned P-channel type MOS transistors T1 and T3 are formed of the thin film transistors and arranged in the upper layer of N-channel type MOS transistors T2 and T4.

Figure 2:
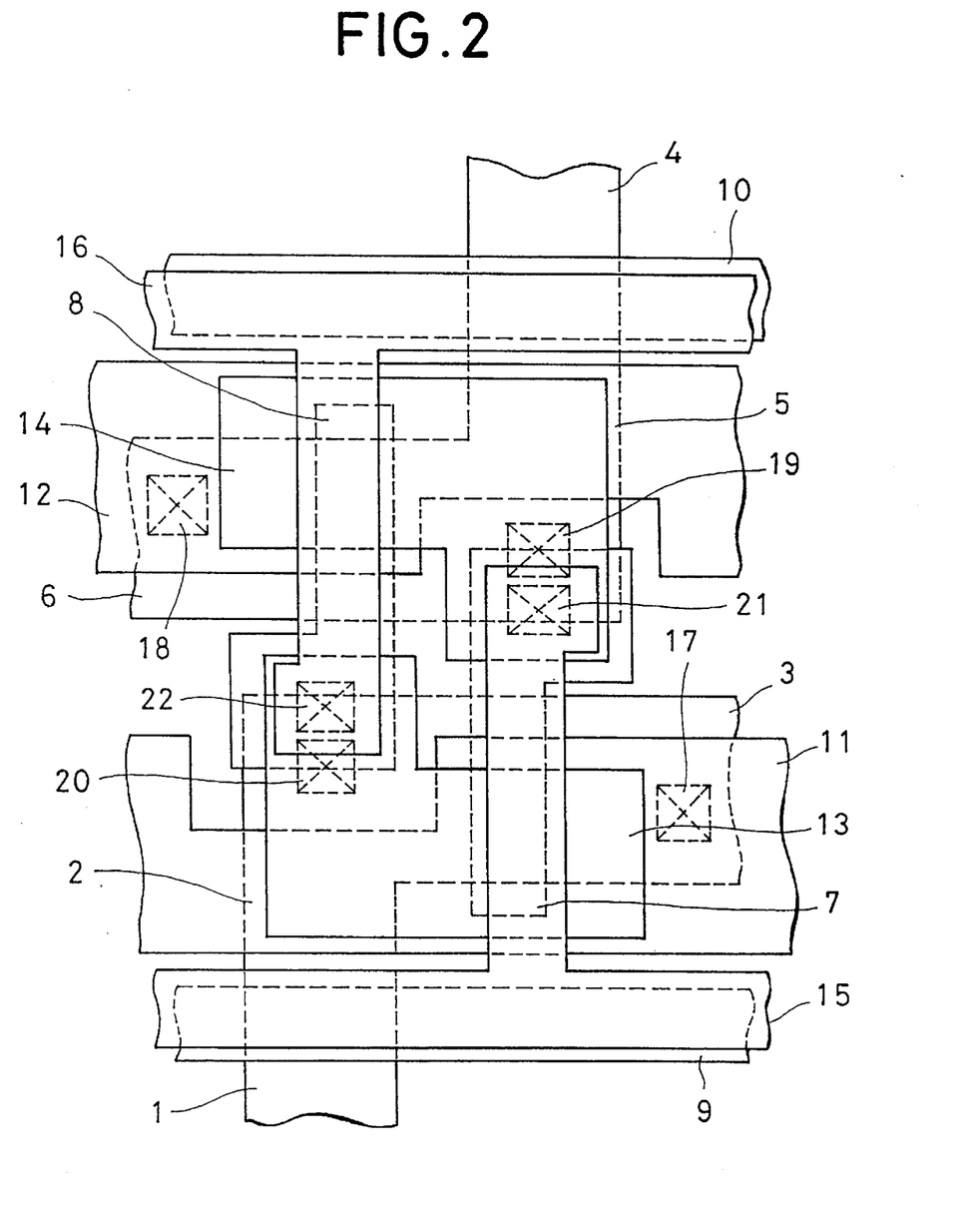
FIG. 2 is a plan view of the one embodiment of the static-type semiconductor device of the invention.

Namely, as shown in FIG. 2, on the surface of the semiconductor substrate formed of silicon, $N^+$ type diffusion layers (impurity doped region) 1 to 3 form source and drain regions of the N-channel type MOS transistors T4 and T6. Also, $N^+$ type diffusion layers 4 to 6 are formed on the semiconductor substrate to form the source and drain regions of the N-channel type MOS transistors T2 and T5.

Reference numeral 7 denotes the gate electrode of the N-channel type MOS transistor T4 formed with a polycrystalline silicon layer (first polycrystalline silicon layer), 8 denotes the gate electrode of the N-channel type MOS transistor T2 formed with a polycrystalline silicon layer (first polycrystalline silicon layer).

Reference numerals 9, 10 denote word lines formed with the polycrystalline silicon layer (first polycrystalline silicon layer), which also serve as gate electrodes of the N-channel type MOS transistors T5 and T6. 11 and 12 denote grounding wiring (GND) of the N-channel type MOS transistors T2 and T4 formed with polycrystalline silicon layers (second polycrystalline silicon layer).

Reference numerals 13 and 14 denote TFT gate electrodes of the P-channel type MOS transistors T1 and T3 formed of polycrystalline silicon layers (third polycrystalline silicon layer) containing 2 to 45 atoms %, more preferably 10 to 15 atoms % of oxygen. 15 and 16 denote polycrystalline silicon layers (fourth polycrystalline silicon layer) forming the source and drain channel regions of the P-channel type MOS transistor and, as well, serving as Vcc wirings.

Reference numerals 17 and 18 denote through holes for connecting the $N^+$ diffusion layer and the grounding wiring, 19 and 20 denote through holes for simultaneously connecting the gate electrode, the TFT gate electrode and the $N^+$ diffusion layer, and 21 and 22 denote through holes connecting the TFT electrode and the TFT drain region.

In the $N^+$ diffusion layers 1 and 4, through holes (not shown) for connecting bit lines (not shown) are opened. With the construction set forth above, the memory cell on the surface of the semiconductor substrate is realized.

Figure 3:
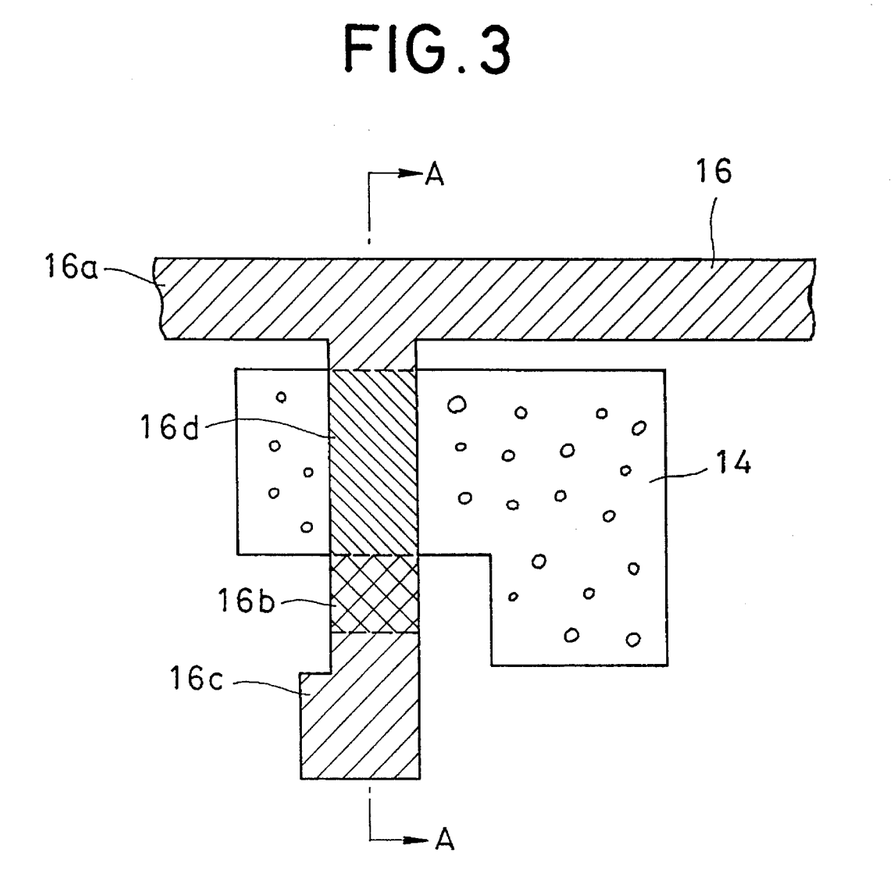
FIG. 3 is a plan view of a thin film transistor employed in the one embodiment of the static-type semiconductor device according to the invention.
Figure 4:
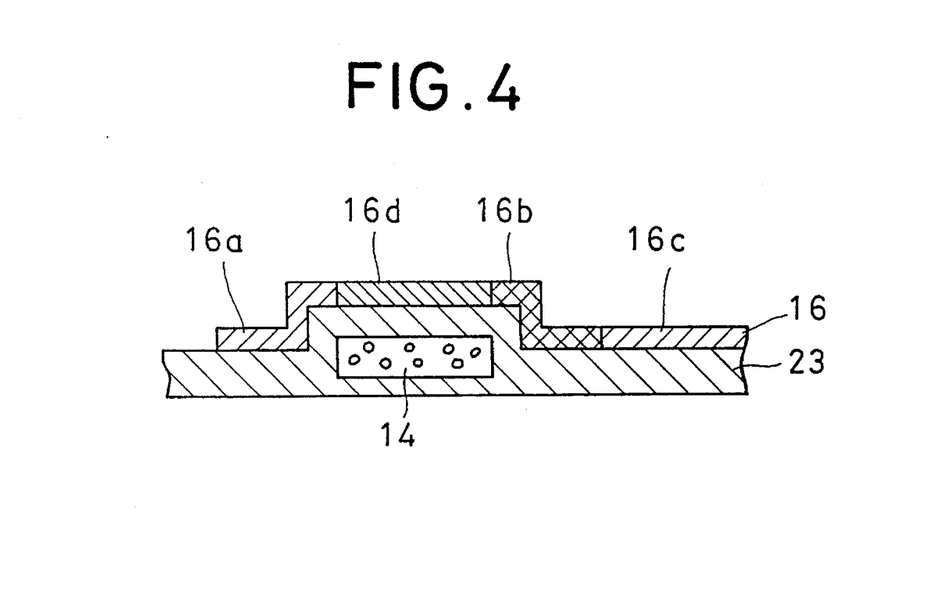
FIG. 4 is a section taken along line A—A of FIG. 3.

On the other hand, as shown in FIGS. 3, 4, the thin film transistor arranged in the upper layer of the N-channel type MOS transistor T2 comprises TFT gate electrode 14 (third polycrystalline silicon layer) containing 2 to 45 atoms % of oxygen, and the polycrystalline silicon layer 16 (fourth polycrystalline silicon layer) forming the source and drain channel regions of the P-channel type MOS transistor T1.

A $P^+$ implanting region 16a of the polycrystalline silicon layer 16 is a source region which also serves as the Vcc wiring. In the $P^+$ implanting region 16a, a high concentration P-type impurity ($P^+$) is implanted. A $P^-$ implanted region 16b and a $P^+$ implanted region 16c are drain regions. In the $P^-$ implanted region 16b, low concentration P-type impurity ($P^-$) is implanted, and in the $P^+$ implanted region 16c, high concentration P-type impurity ($P^+$) is implanted interfacing with the $P^-$ implanted region 16b. Here, 16d denotes a channel region.

Reference numeral 23 denotes an insulation layer disposed between the TFT gate electrode 25 and the polycrystalline silicon layer 16. With the construction set forth above, the thin film transistor is formed.

Here, discussion will be given for the polycrystalline silicon layer containing 2 to 45 atoms % of oxygen and called as SIPOS. In the small capacity static-type semiconductor memory device having a storage capacity less than or equal to 1 Mbit, a resistor with polycrystalline silicon layer is used as a load for the memory cell in place of the thin film transistor.

In order to stabilize the resistance value and provide high resistance for such polycrystalline silicon layer, the technology referred to as SIPOS is employed. SIPOS is known to have excellent characteristics causing little variation of resistance value even when impurity, such as phosphorous or so forth is diffused through the through hole. A technology of high resistance load element employing SIPOS is disclosed in Japanese Unexamined Patent Publication (Kokai) No. Heisei 2-58868. The disclosure of the above-identified publication is herein incorporated by reference for the sake of completion.

Accordingly, by forming the TFT gate electrodes 13 and 14 of FIGS. 2 to 4 with SIPOS, the high resistance can be maintained even when the impurity, such as phosphorous or so forth is diffused through the through hole. Therefore, resistance against soft errors can be improved. Particularly, in the polycrystalline silicon layer containing oxygen in a range of 10 to 15 atoms %, remarkable effect was confirmed through experiments.

As set forth above, by forming the P-channel type MOS transistors T1 and T3 employed in the memory cell in the static-type semiconductor device with polycrystalline silicon layers (SIPOS) containing 2 to 45 atoms % of oxygen, high resistance can be maintained even when impurity, such as phosphorous is diffused through the through hole. Therefore, excellent resistance against soft errors can be realized.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which fall within the spirit and scope encompassed herein and equivalents thereof with respect to the features set out in the appended claims.

What is claimed is:

1. A static-type memory cell comprising:

a flip-flop formed with a pair of driving N-channel type MOS transistors provided in a semiconductor substrate, and a pair of P-channel type MOS transistors, formed with thin film transistors, constituting load elements provided in the upper layer of said pair of driving N-channel type MOS transistors;

gate electrodes of said pair of P-channel type MOS transistors constituting load elements, and being formed of polycrystalline silicon layers containing 2 to 45 atoms % of oxygen.

2. A static-type memory cell as set forth in claim 1, wherein each of said thin film transistor comprises a polycrystalline silicon layer forming source and drain channel regions of said P-channel type MOS transistors as the load element, the gate electrode of P-channel type MOS transistor as the load element, and an insulation layer interposed between said polycrystalline silicon layer and said gate electrode.

3. A static-type memory cell as set forth in claim 1, wherein said gate electrodes is formed of polycrystalline silicon layer containing 10 to 15 atoms % of oxygen.

4. A static-type semiconductor memory device comprising:

a memory cell array constituted of flip-flops, each being formed with a pair of driving N-channel type MOS transistors provided in a semiconductor substrate, and a pair of P-channel type MOS transistors, formed with thin film transistors, constituting load elements provided in the upper layer of said pair of driving N-channel type MOS transistors;

gate electrodes of said pair of P-channel type MOS transistors constituting load elements, and being formed of polycrystalline silicon layers containing 2 to 45 atoms % of oxygen.

5. A static-type semiconductor memory device as set forth in claim 4, wherein said gate electrodes are formed of polycrystalline silicon layer containing 10 to 15 atoms % of oxygen.

6. A static-type memory cell comprising:

a flip-flop formed with a pair of driving N-channel type MOS transistors provided in a semiconductor substrate, and a pair of P-channel type MOS transistors, formed with thin film transistors, constituting load elements provided in the upper layer of said pair of driving N-channel type MOS transistors, said P-channel type MOS transistors including gate electrodes formed of polycrystalline silicon layers containing 2 to 45 atoms % of oxygen.

7. A static-type memory cell as set forth in claim 6, wherein said gate electrodes are formed of polycrystalline silicon layer containing 10 to 15 atoms % of oxygen.

8. A static-type semiconductor memory device comprising:

a memory cell array constituted of flip-flops, each flip-flop being formed with a pair of driving N-channel type MOS transistors provided in a semiconductor substrate, and a pair of P-channel type MOS transistors, formed with thin film transistors, constituting load elements provided in the upper layer of said pair of driving N-channel type MOS transistors, said P-channel type MOS transistors including gate electrodes formed of polycrystalline silicon layers containing 2 to 45 atoms % of oxygen.

9. A static-type memory cell as set forth in claim 8, wherein said gate electrodes are formed of polycrystalline silicon layer containing 10 to 15 atoms % of oxygen.

10. A static-type semiconductor memory device comprising:

a flip-flop formed with a pair of driving N-channel type MOS transistors provided in a semiconductor substrate, and a pair of P-channel type MOS transistors, formed with thin film transistors, as load elements provided in the upper layer of said pair of driving N-channel type MOS transistors;

a pair of N-channel type MOS transistors as transfer gates respectively provided between complementary data storage nodes of said flip-flop and complementary bit lines;

wherein gate electrodes of said pair of P-channel type MOS transistors constituting load elements being formed of polycrystalline silicon layers containing 2 to 45 atoms % of oxygen.

11. A static-type memory cell as set forth in claim 10, wherein said gate electrodes are formed of polycrystalline silicon layer containing 10 to 15 atoms % of oxygen.

12. A static-type semiconductor memory device comprising:

a memory cell array constituted by flip-flops, each being formed with a pair of driving N-channel type MOS transistors provided in a semiconductor substrate, and a pair of P-channel type MOS transistors, formed with thin film transistors, as load elements provided in the upper layer of said pair of driving N-channel type MOS transistors, and a pair of N-channel type MOS transistors as transfer gates respectively provided between complementary data storage nodes of said flip-flops and complementary bit lines;

wherein gate electrodes of said pair of P-channel type MOS transistors constituting load elements being formed of polycrystalline silicon layers containing 2 to 45 atoms % of oxygen.

13. A static-type semiconductor memory device as set forth in claim 12, wherein said gate electrodes are formed of polycrystalline silicon layer containing 10 to 15 atoms % of oxygen.

14. A static-type semiconductor memory device comprising:

a flip-flop formed with a pair of driving N-channel type MOS transistors provided in a semiconductor substrate, and a pair of P-channel type MOS transistors, formed with thin film transistors, as load elements provided in the upper layer of said pair of driving N-channel type MOS transistors;

a pair of N-channel type MOS transistors as transfer gates respectively provided between complementary data storage nodes of said flip-flop and complementary bit lines;

said P-channel type MOS transistors including gate electrodes formed of polycrystalline silicon layers containing 2 to 45 atoms % of oxygen.

15. A static-type memory cell as set forth in claim 14, wherein said gate electrodes are formed of polycrystalline silicon layer containing 10 to 15 atoms % of oxygen.

16. A static-type semiconductor memory device comprising:

a memory cell array constituted by flip-flops, each being formed with a pair of driving N-channel type MOS transistors provided in a semiconductor substrate and a pair of P-channel type MOS transistors, as formed with thin film transistors, as load elements provided in the upper layer of said pair of driving N-channel type MOS transistors, and a pair of N-channel type MOS transistors as transfer gates respectively provided between complementary data storage nodes of said flip-flop and complementary bit lines;

said P-channel type MOS transistors including gate electrodes formed of polycrystalline silicon layers containing 2 to 45 atoms % of oxygen.

17. A static-type semiconductor memory device as set forth in claim 16, wherein said gate electrodes are formed of polycrystalline silicon layer containing 10 to 15 atoms % of oxygen.

* * * * *